United States Patent [19]

Shiozawa et al.

[11] Patent Number: 5,451,809
[45] Date of Patent: Sep. 19, 1995

[54] SMOOTH SURFACE DOPED SILICON FILM FORMATION

[75] Inventors: Jun-ichi Shiozawa, Wappingers Falls; Yoshitaka Tsunashima, Poughkeepsie, both of N.Y.

[73] Assignee: Kabushiki Kaisha Toshiba, Japan

[21] Appl. No.: 301,625

[22] Filed: Sep. 7, 1994

[51] Int. Cl.⁶ .................. H01L 27/02; H01L 29/68; H01L 29/78
[52] U.S. Cl. .................. 257/516; 257/52; 257/301; 257/514; 257/636; 257/640; 437/60; 437/67; 437/161; 437/9.19
[58] Field of Search ............... 257/301, 303, 304, 514, 257/516, 636, 640, 52; 437/60, 67, 161, 919

[56] References Cited

U.S. PATENT DOCUMENTS

| | | |
|---|---|---|
| 4,471,525 | 9/1984 | Sasaki . |
| 4,569,701 | 2/1986 | Oh . |
| 4,604,150 | 8/1986 | Lin . |
| 4,656,497 | 4/1987 | Rogers et al. . |
| 4,676,847 | 6/1987 | Lin . |
| 4,907,047 | 3/1990 | Kato et al. . |
| 4,971,926 | 11/1990 | Kinugawa . |
| 5,066,609 | 11/1991 | Yamamoto et al. ............... 257/301 |
| 5,160,988 | 11/1992 | Higuchi et al. . |
| 5,173,440 | 12/1992 | Tsunashima et al. . |
| 5,227,329 | 7/1993 | Kobayashi et al. . |
| 5,270,244 | 12/1993 | Baliga . |
| 5,272,102 | 12/1993 | Hur et al. . |
| 5,283,453 | 2/1994 | Rajcevakumar ............... 257/301 |
| 5,292,679 | 3/1994 | Anzai . |
| 5,292,692 | 3/1994 | Maloney et al. . |
| 5,310,698 | 5/1994 | Wild . |

OTHER PUBLICATIONS

Nesbit, et al., "A 0.6 μm² 256Mb Trench DRAM Cell With Self-Aligned BuriEd STrap (BEST)", *IDEM*, Dec. 5, 1993, pp. 26.2.1-26.2.4.

*Primary Examiner*—Ngân Ngô
*Attorney, Agent, or Firm*—Banner & Allegretti, Ltd.

[57] ABSTRACT

A semiconductor device has a substrate and a trench formed therein, the semiconductor device including a dielectric formed on the surface of the trench, a first amorphus silicon film formed on the dielectric film, a dopant film, a second amorphus silicon film, and a capping film formed between the dopant film and one of the first and second amorphus silicon films, the dopant film being formed between the other of the first and second amorphus silicon films and the capping film. The capping film is formed from one of silicon oxide and silicon nitride. A method of forming a film structure in a trench, the trench having a dielectric film formed on a surface of the trench, includes steps of a forming a first amorphus silicon film on the dielectric film, forming a dopant film, forming a second amorphus silicon film and forming a capping film between the dopant film and one of the first and second amorphus silicon films, the dopant film being formed between the other of the first and second amorphus silicon films and the capping film.

10 Claims, 13 Drawing Sheets

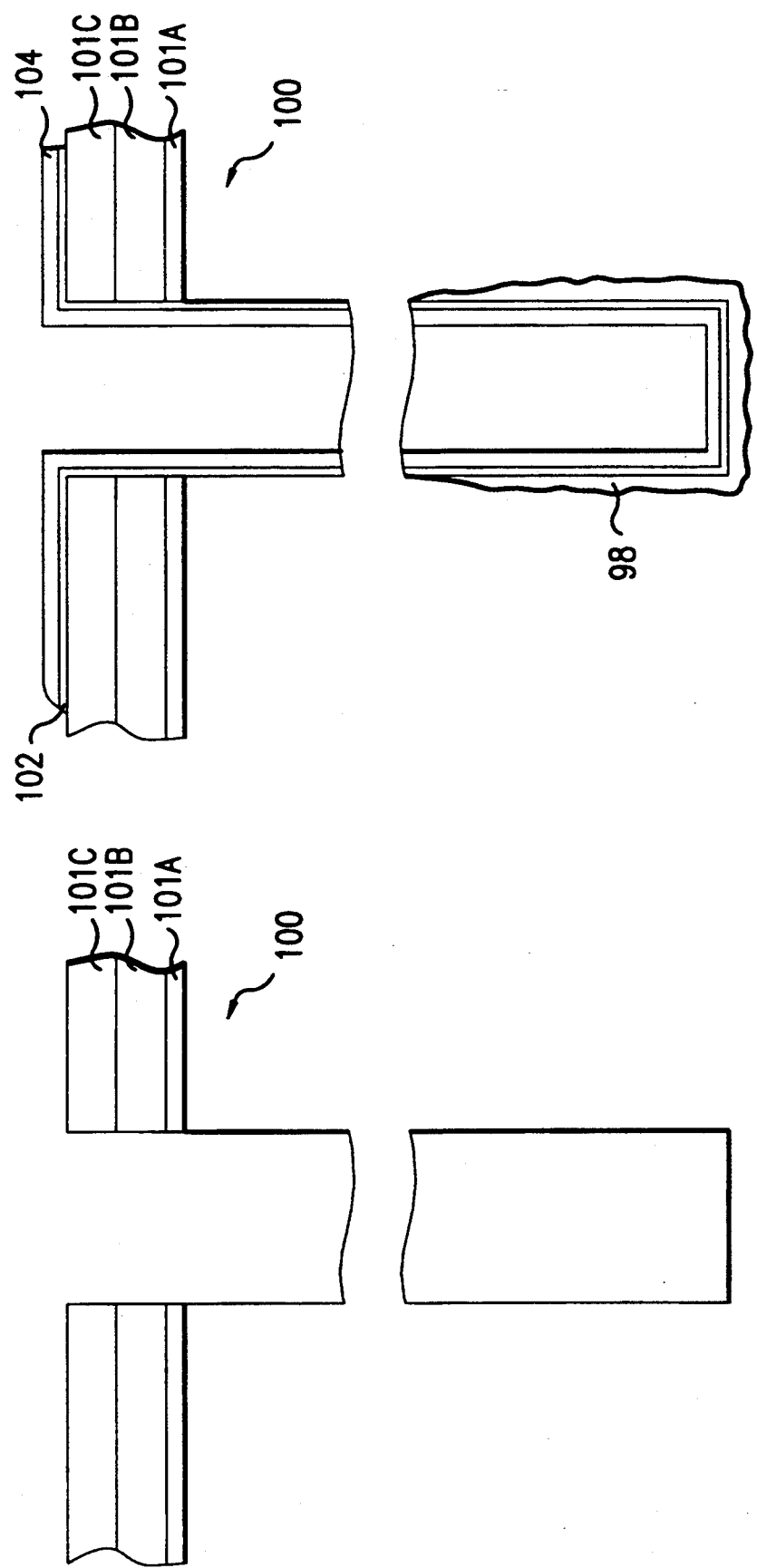

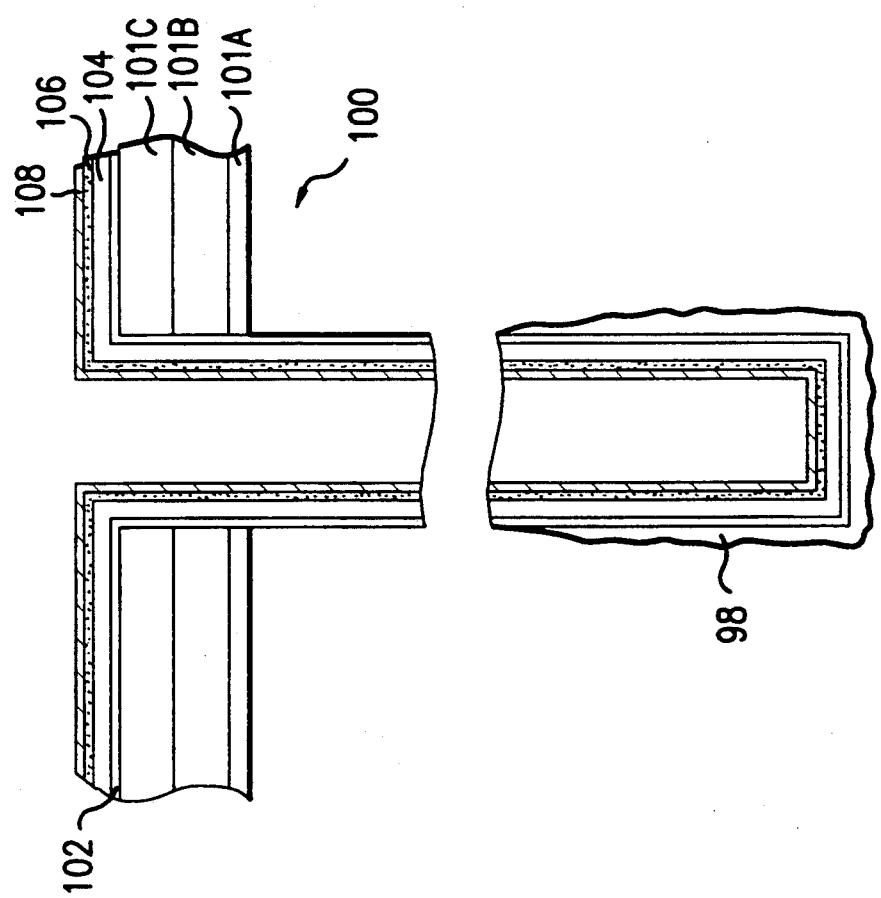
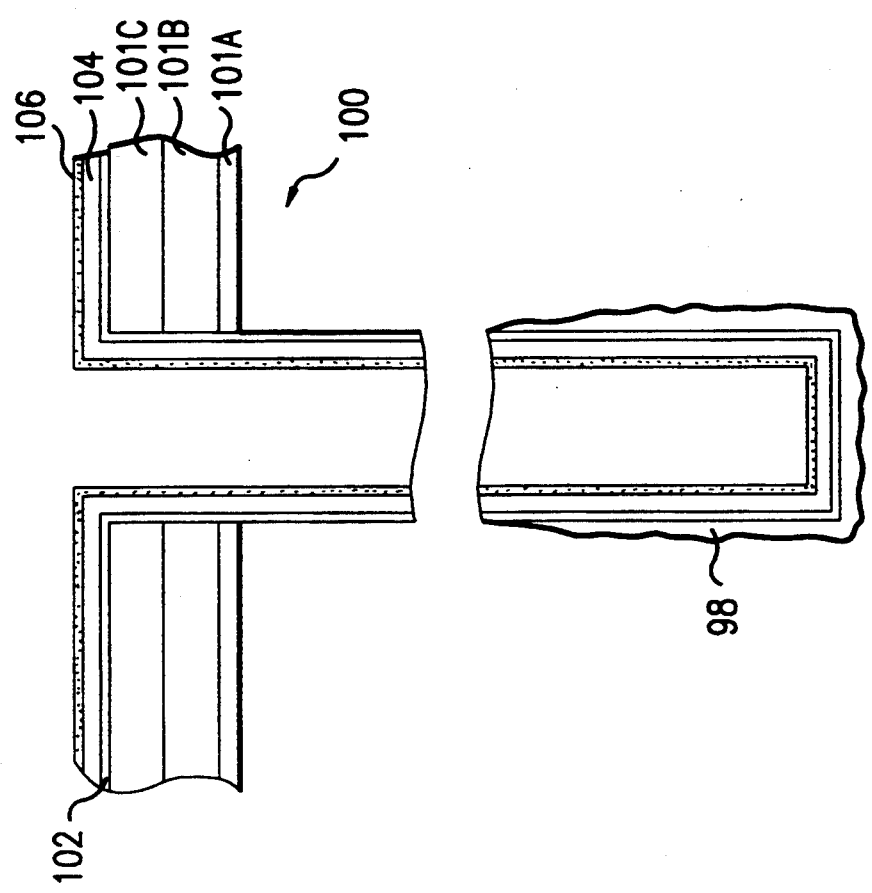

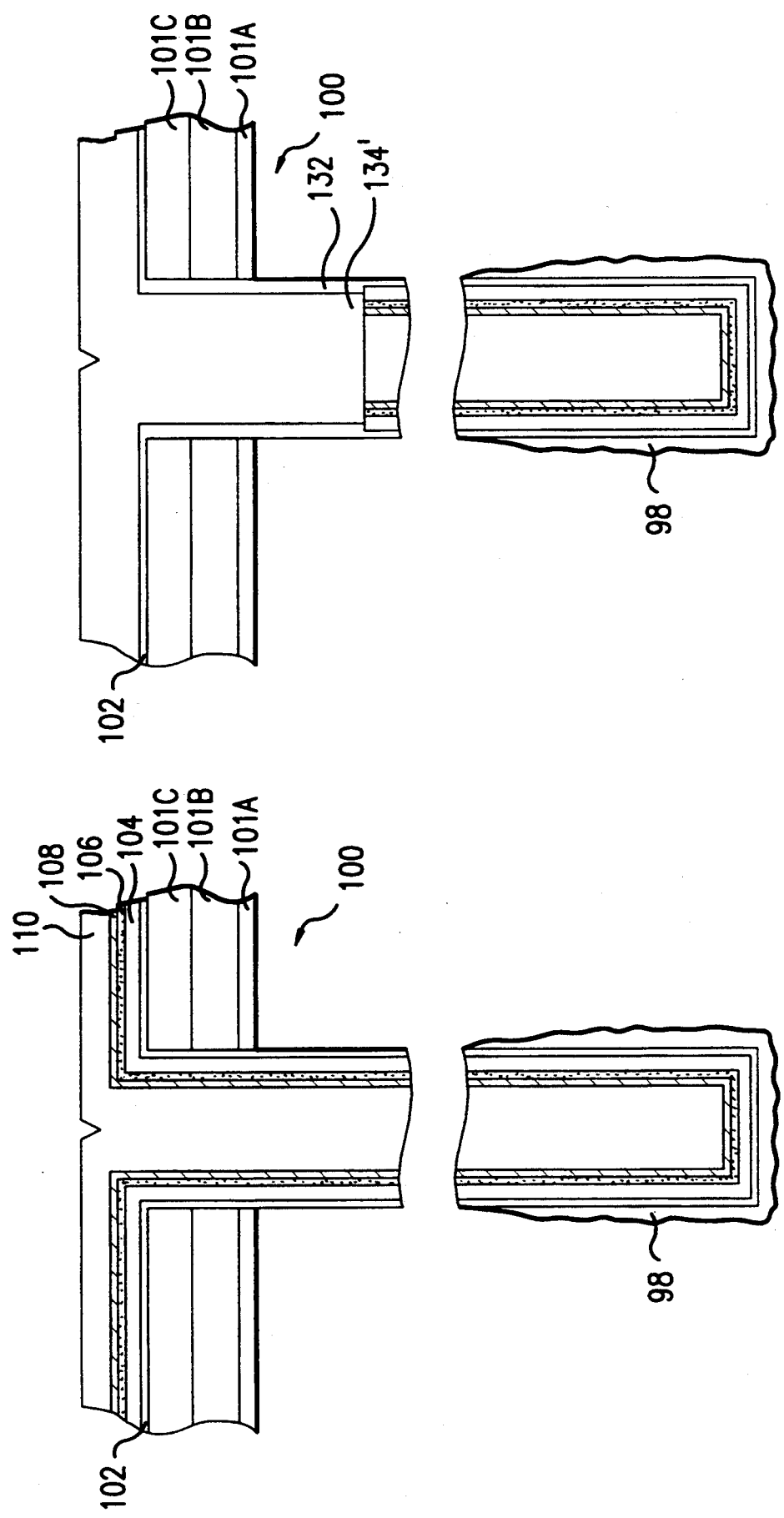

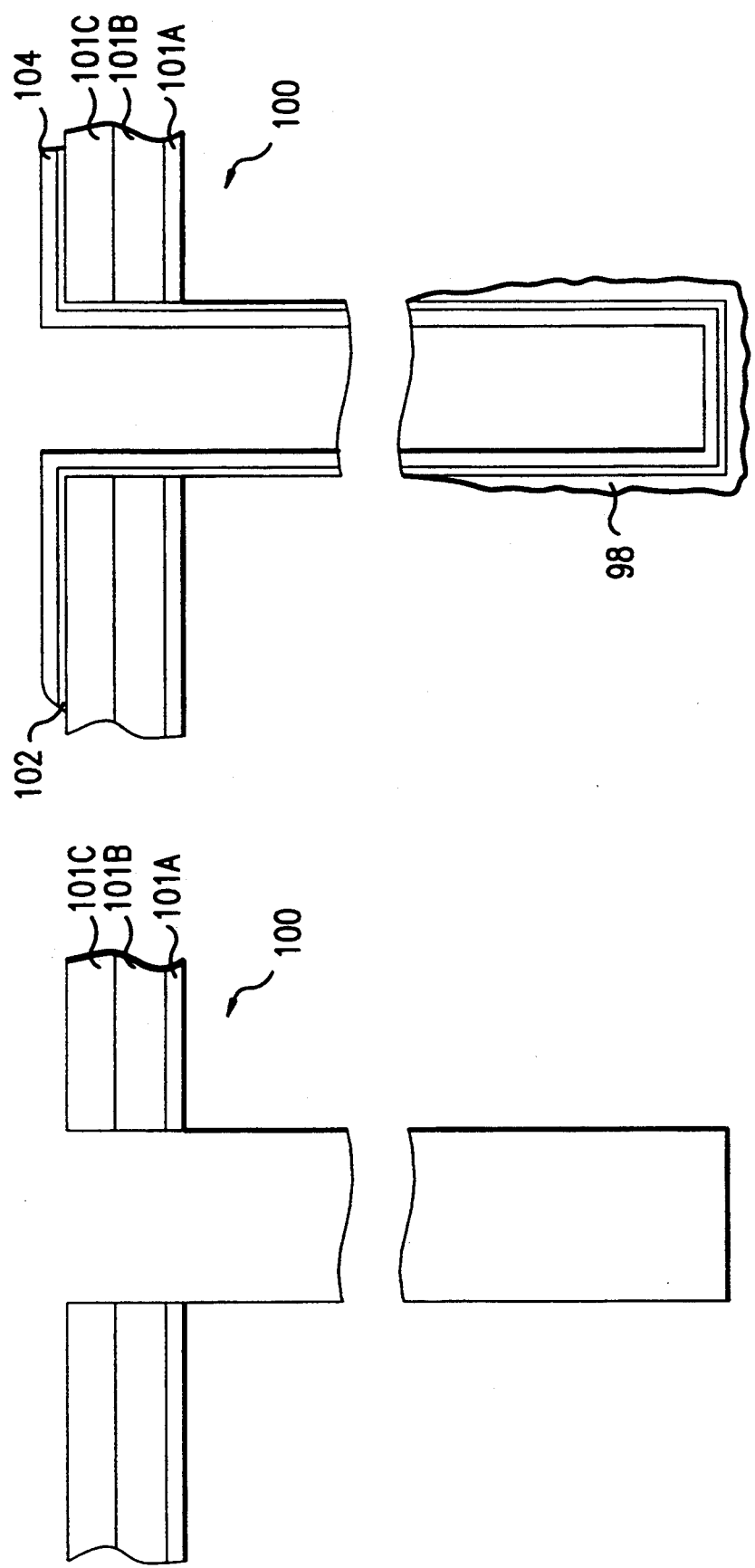

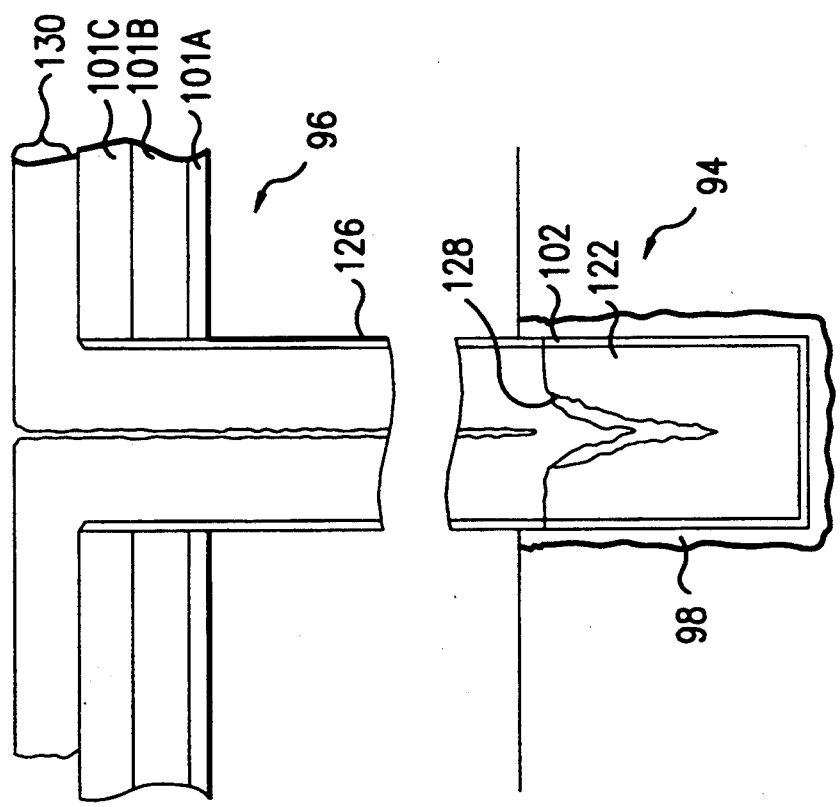
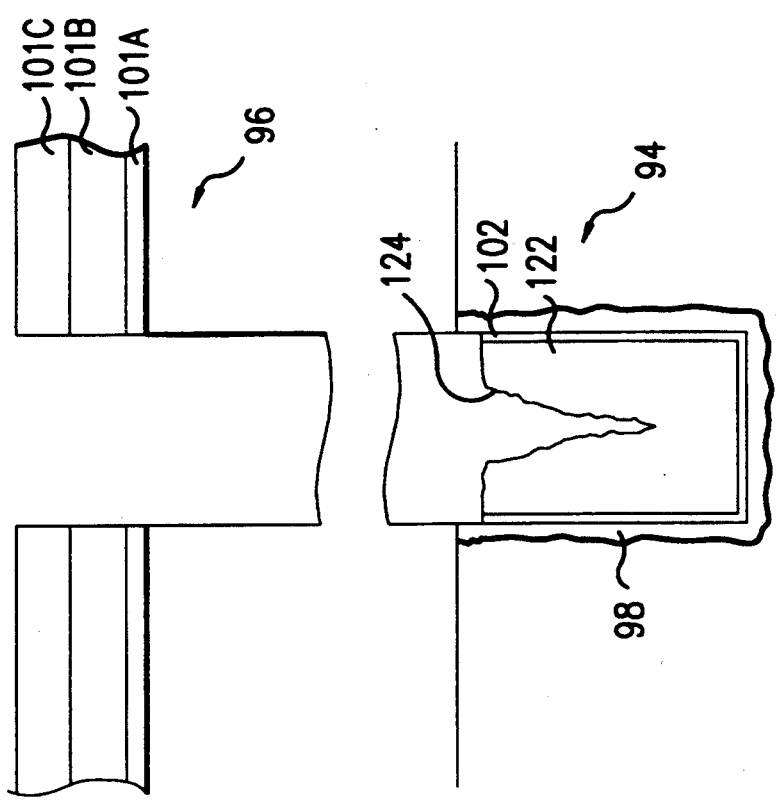
FIG. 6D
FIG. 6C

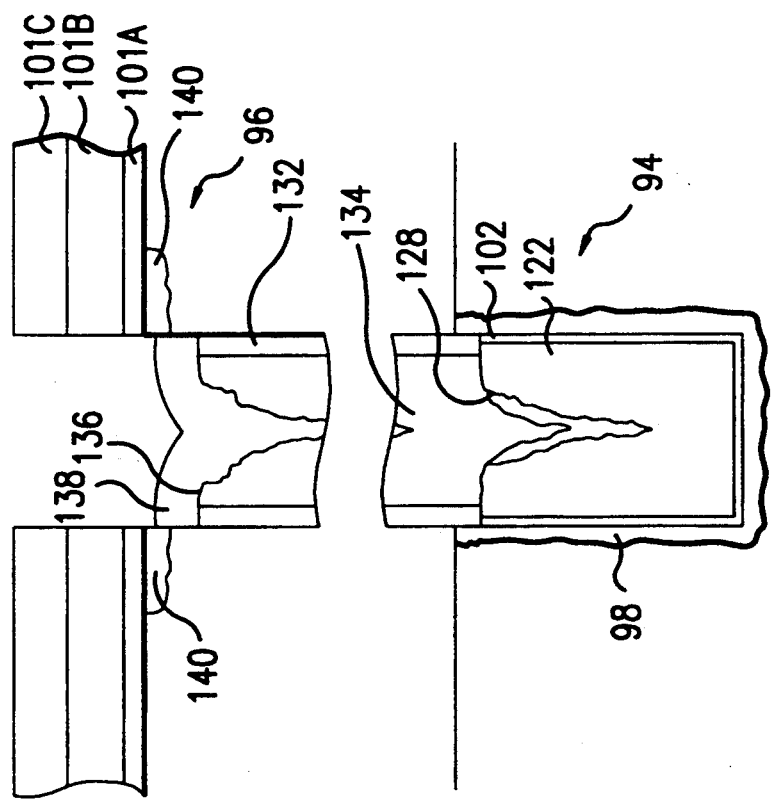
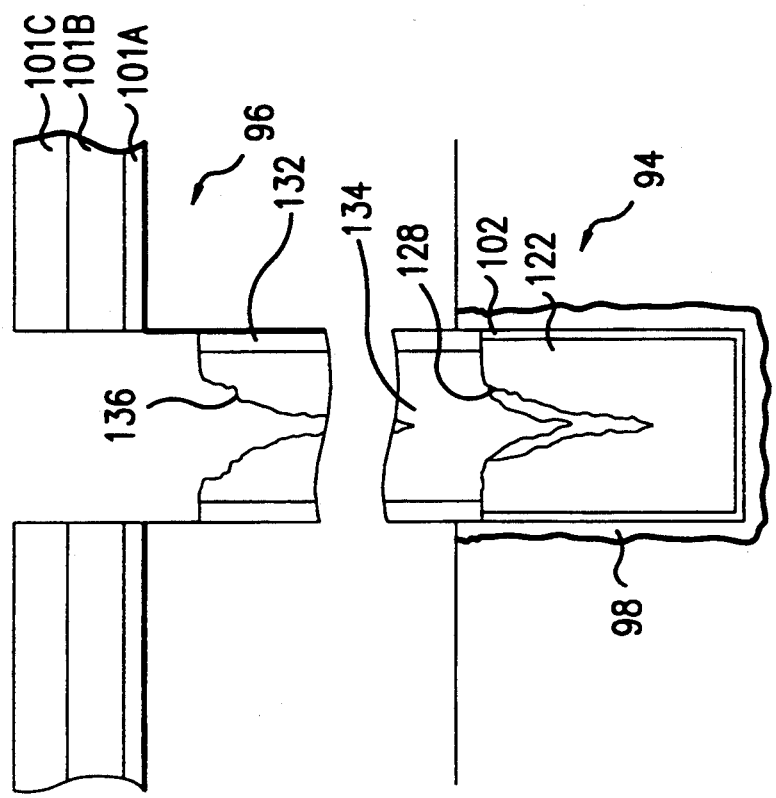

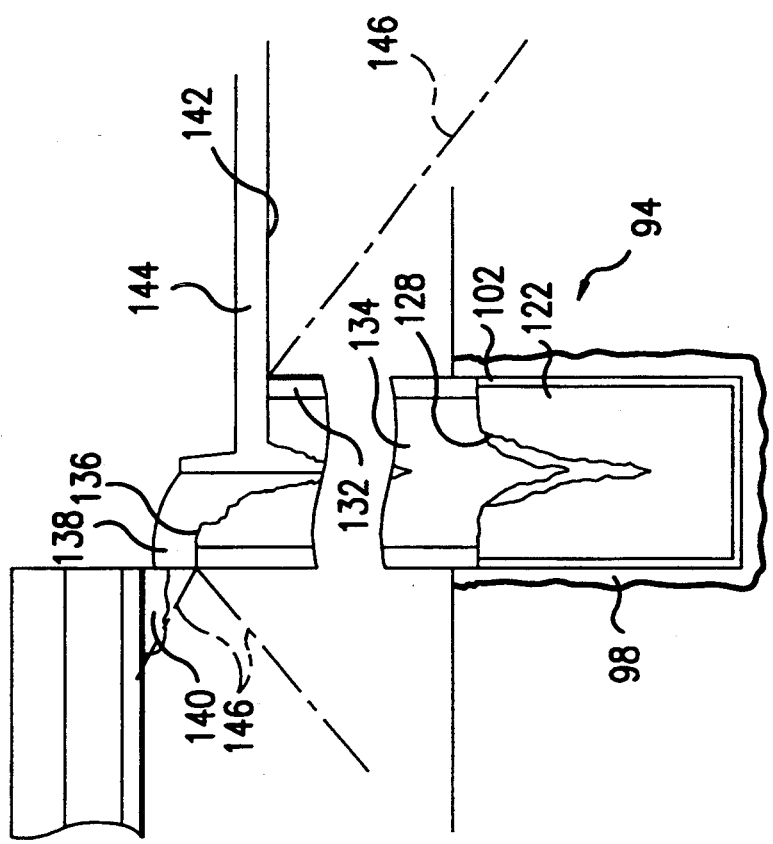

SMOOTH SURFACE DOPED SILICON FILM FORMATION

BACKGROUND OF THE INVENTION

1. Field of the Invention

The present invention relates to doped silicon films formed in integrated circuit semiconductors, and in particular, the invention relates to doped silicon films formed in trench structures, a preferred application being a doped silicon film formed in a deep trench structure to achieve improved trench capacitors for DRAMs.

2. Description of Related Art

Deep and shallow trenches are used in the process of manufacturing dynamic random access memories (DRAMs). Deep trenches are preferably used in forming trench type capacitors, and shallow trenches are preferably used in forming electrical isolation barriers between semiconductor regions. Shallow trench isolation techniques (sometimes referred to as STI techniques) include filling the trench with an electrical insulator, for example, silicon dioxide. In contrast, deep trench capacitor structures are formed with the trench filled with electrically conductive materials, for example, doped poly-silicon. The capacitor structure includes a conductive layer to function as a capacitor plate, an insulator layer to function as a capacitor dielectric and another conductive layer to function as a capacitor electrode or storage node. Deep trenches are preferred over shallow trenches to form capacitors since the deeper the trench the greater is the capacitive area between the capacitor plate and the capacitor electrode.

In U.S. Pat. No. 4,971,926, granted Nov. 20, 1990 to Kinugawa, a method of manufacturing a semiconductor device is described as using deep trench technology for both isolation barriers and trench capacitors. FIG. 7 of the present application corresponds to FIG. 2 of the Kinugawa patent. In FIG. 7, a DRAM memory cell capacitor element illustrates an application of the groove or deep trench technology. A field oxide film 12 is formed by a selective oxidation process on the surface of silicon substrate 11. The field oxide film 12 isolates a surrounded memory cell region. A groove having a substantially rectangular sectional profile is formed by a reactive ion etching process in the memory cell region. An n type impurity region 15 is formed by doping the silicon substrate 11 with an n type impurity from the wall surface of the groove. An oxide film 13 is formed by thermal oxidation. An electrode 14 consisting of a polycrystalline silicon layer, doped to be conductive, is formed over the thermal oxide film 13 in the groove. Transistor 16 is a transfer transistor of the DRAM memory cell. By forming the capacitor element so as to use the wall surface of the groove, it is possible to reduce the element area exclusively occupied by the capacitor element and hence increase the integration density. This method of improving the integration density by making use of a groove having walls perpendicular to the principal surface of the substrate also finds extensive applications to resistor elements.

Formation of capacitor electrode 14 is a critical process. It is generally difficult but desirable to form conformal films as electrode 14 when using an insitu doped polycrystalline silicon technique. To obtain a conformal film for use as capacitor electrodes, the present inventors have used a layer process. The layer process includes steps of first depositing intrinsic amorphus silicon layer, then depositing a dopant (e.g., arsenic or phosphorus) layer, and finally depositing another intrinsic amorphus silicon layer. This results in a conformal process which capable of filling deep trenches.

FIGS. 4A–4C and FIGS. 5A–5D illustrate this layer process for forming doped silicon films in deep trenches. In FIG. 4A, dielectric 102 (e.g., silicon dioxide or silicon nitride) is formed on silicon substrate 100. Thereafter, amorphus silicon 104 is formed on dielectric 102. In FIG. 4B, dopant film 106 is formed on amorphus silicon film 104. In FIG. 4C, amorphus silicon film 112 is formed on dopant film 106. Subsequent heating of such a structure diffuses the dopant into the amorphus so as to render conductive the films 104, 106 and 112. However, in FIG. 4C, rough surface 114 results from this method of forming doped silicon films.

This method of film formation may be applied to formation of a trench capacitor structure. In FIG. 5A, doped silicon substrate 100, preferably n type semiconductor, is processed to form thereon silicon dioxide pad layer 101A, silicon nitride pad layer 101B and silicon dioxide mask layer 101C. A deep trench is etched, preferably by reactive ion etching (RIE), using silicon dioxide mask 101C to define the trench pattern. Typically, the trench is etched to a depth of from 4 to 8 microns, but deeper or shallower trenches may be used.

Outdiffusing a dopant (e.g., arsenic) in substrate 100 may be used to form capacitor plate 98 (e.g., of n$^+$ type semiconductor). Dielectric 102 (e.g., silicon dioxide or silicon nitride as in FIG. 4A) is conformally formed in the trench on silicon substrate 100 as a storage node dielectric as shown in FIG. 5B.

The process for forming a doped silicon film used by the present inventors to obtain a conformal film for use as a capacitor electrode is applied on storage node electrode dielectric 102 (FIGS. 4A and 5B). First, amorphus silicon layer 104 is formed on dielectric 102 (FIG. 5B). Then, dopant film 106 (e.g., arsenic) is formed on amorphus silicon film 104 (FIG. 5C). Finally, amorphus silicon film 112 is then formed on dopant film 106 (FIG. 5D). Seam 116 having voids therein typically remains along the center line of the trench as a result of rough surface 114 (FIG. 4C). Heating the stacked layers of films 104, 106 and 112 tends to diffuse dopant film 106 into amorphus silicon films 104 and 112 to produce a conductive structure which conformably fills the deep trench and is useable as a capacitor electrode.

In this method of forming doped silicon films, the dopant film, often an arsenic layer, locally inhibits the growth of second amorphus silicon film 112. The second amorphus silicon film (i.e., amorphus silicon film 112) grows with discontinuous islands of growth due to the local inhibiting effects of dopant film 106 resulting in rough surface 114 (FIG. 4C). When such films are formed in deep trenches, seams and voids are formed along line 116 perpendicular to the semiconductor's principal surface (FIG. 5D).

The trench capacitor so formed has capacitor plate 98 and a capacitor electrode made of the conformally applied doped silicon film formed from films 104, 106 and 112 and has capacitor dielectric 102 disposed therebetween. This capacitor performs well; however, the seams and voids along line 116 may cause problems for subsequent semiconductor processing.

In FIG. 6A, substrate 100 is replaced with buried n-well 94 and p-well 96. Capacitor plate 98 is preferably formed of an n+ diffusion region formed in buried n-well 94. Other elements in FIG. 6A are the same as in FIG. 5B. In FIG. 6B, first doped silicon film 120 is formed from stacked films 104, 106 and 112 as described above with respect to FIG. 5D.

The subsequent processing steps include recess etching the trench, preferably by reactive ion etching (RIE). First doped silicon film 120 (FIG. 6B) is etched to form shortened first filling silicon 122 which is conductive just as film 120 is conductive. Because of the voids and seems in first doped silicon film 120, the recess etching process causes first rough notch 124 to be formed. In FIG. 6C, dielectric 102 is etched back as tar as is shortened first filling silicon 122. Alternatively, portions of dielectric 102 may be left on the entirety of the side walls of the deep trench.

Next, it is desirable to form oxide collar 126 (FIG. 6D) to insulated conductive first filling silicon 122 from p-well 96. The portion of the collar oxide which is largely parallel with the principal surface of the semiconductor is etched off. However, when forming collar oxide 126, first rough notch oxide 128 which is largely perpendicular to the principal surface of the semiconductor is unavoidably formed. If there were no first rough notch 124 (FIG. 6C) and first filling silicon 122 were to have a flat surface, it would be easier to avoid forming rough notch oxide 128 (FIG. 6D) since all of the surface of first filling silicon 122 would be largely parallel to the principal surface of the semiconductor. Thereafter, second doped silicon film 130 is formed from stacked films 104, 106 and 112 as described above with respect to FIG. 5D.

Again, recess etching is used to etch back second doped silicon film 130, preferably by reactive ion etching (RIE). Second doped silicon film 130 (FIG. 6D) is etched to form shortened second filling silicon 134 which is conductive just as film 130 is conductive. Because of the voids and seam in second doped silicon film 130, the recess etching process causes second rough notch 136 to be formed. It is desirable that first filling silicon 122 and second filling silicon 134 be electrically conductive; however, a reliable connection is difficult to achieve due to the formation of first rough notch oxide 128. If the seams and voids along line 116 (FIG. 5D) can be avoided, first rough notch oxide 128 can be avoided, and reliable electrical conductivity between first filling silicon 122 and second filling silicon 134 can be achieved. Furthermore, voids and seam in the second filling silicon can lead to cracks and dislocations in the device and a related leakage current.

In FIG. 6F, after second filling silicon 134 is formed, third filling silicon 138 is formed on second filling silicon 134, and third filling silicon 138 is recess etched, preferably by reactive ion etching (RIE). Third filling silicon 138 completes an electrical connection between second filling silicon 134 and source/drain region 140 of an MOS transistor.

In FIG. 6G, shallow trench 142 is formed to make a trench isolation barrier by forming oxide layer 144. Any voids or seams in second filling silicon 134 are also oxidized. The oxidation of seams and voids in second filling silicon 134 causes large stresses around the shallow trench. These stresses cause dislocations in the semiconductor material itself.

SUMMARY OF THE INVENTION

It is an object of the present invention to overcome limitations in the prior art. It is another object of the present invention to form doped silicon films with smooth surfaces. It is yet another object of the present invention to form doped silicon films in deep trench structures so as to smoothly fill the trench. It is yet another object of the invention to form trench capacitors with a capacitor electrode formed from a doped silicon film. It is yet another object of the invention to form trench capacitors with a capacitor electrode formed of at least two separately deposited conductive materials stacked vertically in the trench with reliable conductance therebetween.

These and other objects are achieved with a method of forming a film structure in a trench, the trench having a dielectric film formed on a surface of the trench. The method includes steps of a forming a first amorphus silicon film on the dielectric film, forming a dopant film, forming a second amorphus silicon film and forming a capping film between the dopant film and one of the first and second amorphus silicon films, the dopant film being formed between the other of the first and second amorphus silicon films and the capping film.

These and other objects are achieved in a semiconductor device having a substrate and a trench formed therein, the semiconductor device including a dielectric formed on the surface of the trench, a first amorphus silicon film formed on the dielectric film, a dopant film, a second amorphus silicon film, and a capping film formed between the dopant film and one of the first and second amorphus silicon films, the dopant film being formed between the other of the first and second amorphus silicon films and the capping film. The capping film is formed from one of silicon oxide and silicon nitride.

BRIEF DESCRIPTION OF THE DRAWINGS

The invention will be described in detail in the following description of preferred embodiments with reference to the following figures wherein:

FIGS. 2A–2F are sectional views of a trench at stages of formation of the doped silicon film of the present invention:

FIGS. 5A–5D are sectional views of a trench having a doped silicon film formed therein;

FIGS. 6A–6G are a sectional views of a trench capacitor having capacitor electrode formed from plural silicon depositions.

DETAILED DESCRIPTION OF PREFERRED EMBODIMENTS

Figure 1A:
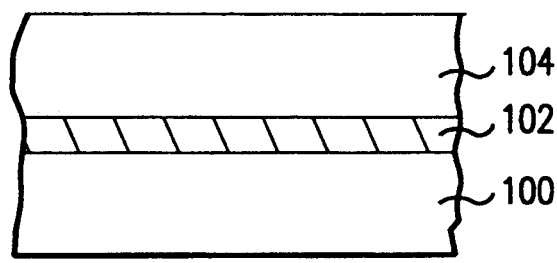
FIGS. 1A–1D are sectional views of a doped silicon film during stages of formation.
Figure 4A:
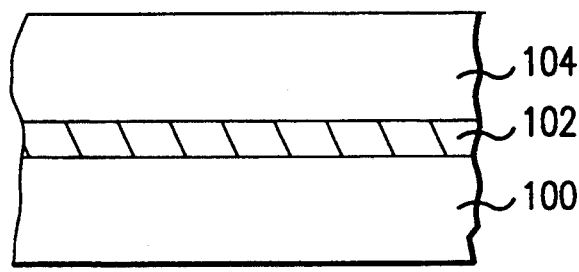
FIG. 4A–4C are sectional views of a doped silicon film during stages of formation.
Figure 4B:
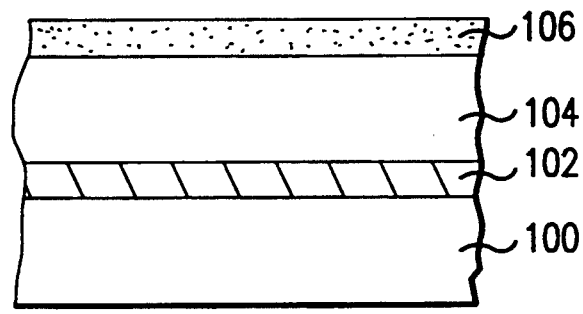
Figure 4C:
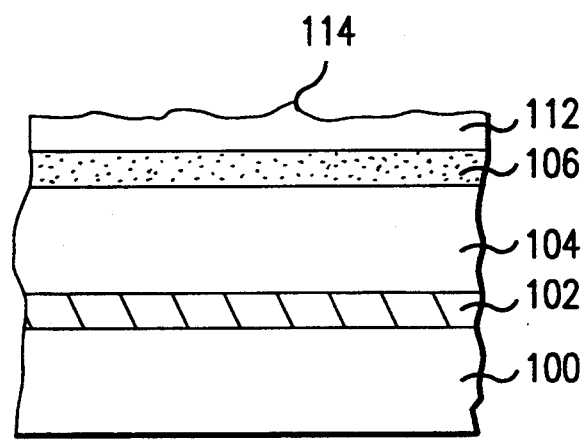
Figure 5D:
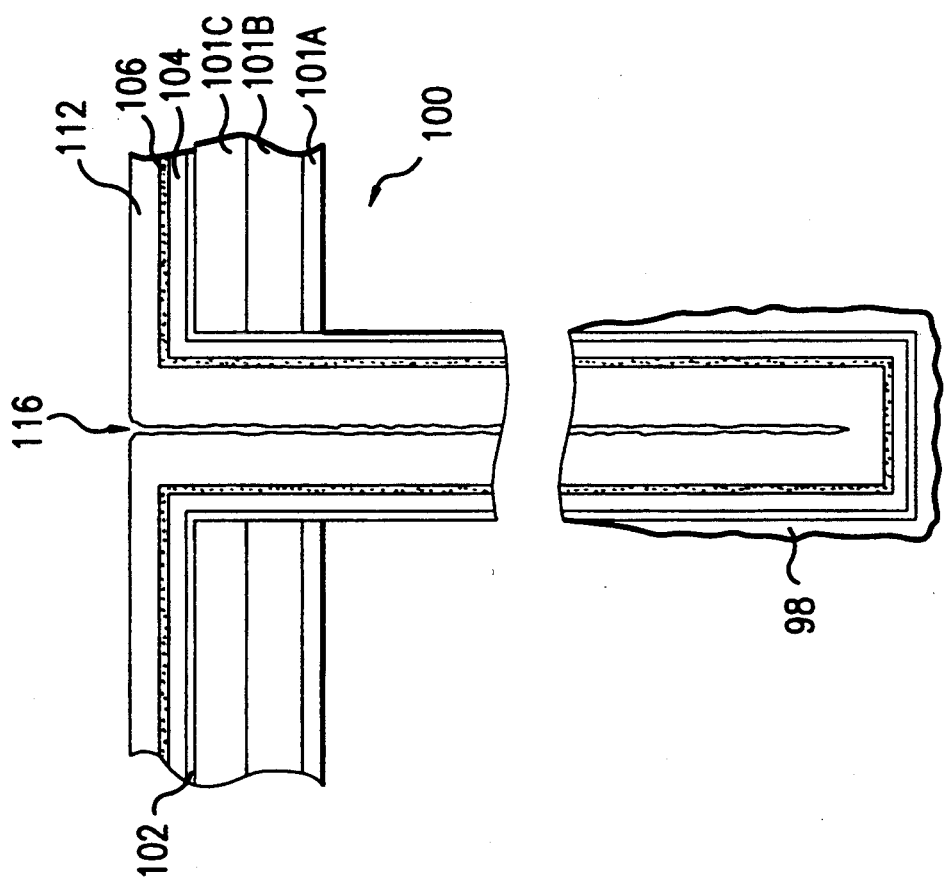
Figure 5C:
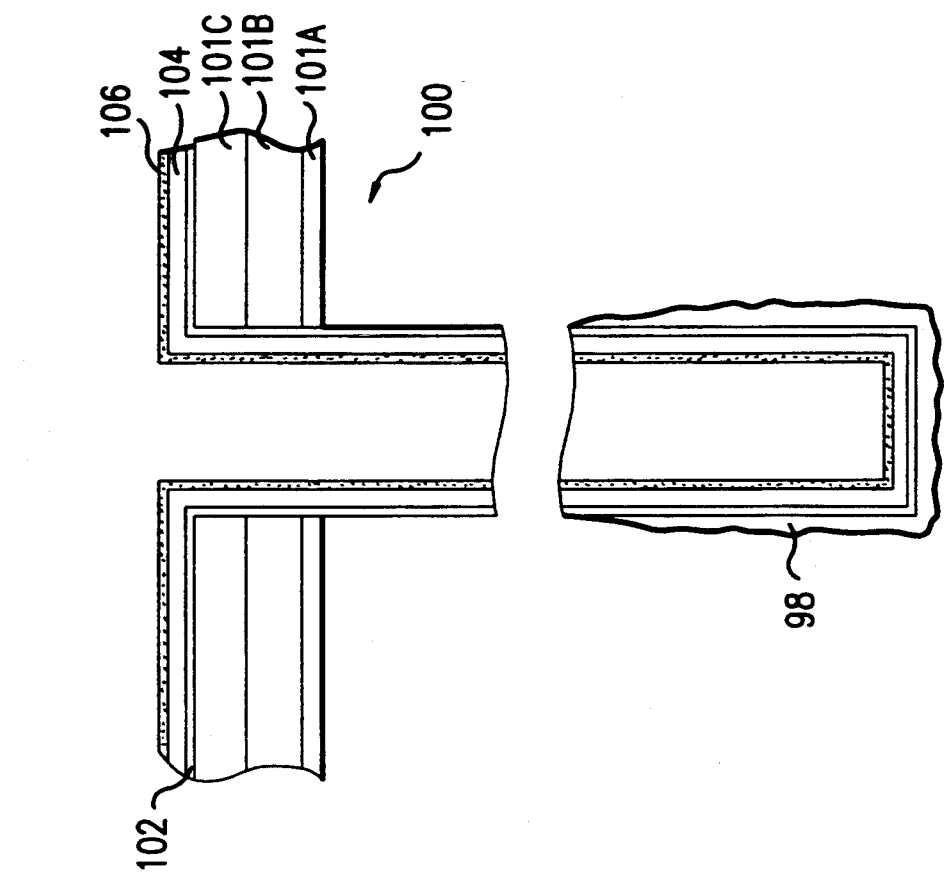

FIG. 1A corresponds to FIG. 4A. In FIG. 1A, dielectric 102 is formed on silicon substrate 100. Similarly, FIG. 2A corresponds to FIG. 5A. In FIG. 2A, silicon dioxide layer 101A, silicon nitride layer 101B, silicon dioxide layer 101C is formed on substrate 100. A trench is etched in the semiconductor device.

In FIG. 1A, amorphus silicon film 104 is formed on dielectric film 102 by low pressure chemical vapor deposition methods. The formation conditions of amorphus silicon film 104 is typically a temperature between 500° C. and 565° C. and a pressure between 100 and 500 milli-Torts. This first processing step, shown in FIG. 3 at S10, deposits amorphus silicon film 104 in the trench as shown in FIG. 2B.

Figure 1B:
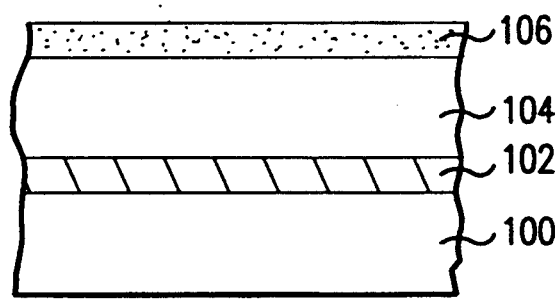

In FIG. 1B, a dopant film (e.g., arsenic and phosphorus and so on) is formed by flowing a dopant gas (e.g., AsH$_3$ or PH$_3$ gas) over the semiconductor device at known temperature and pressure. This process, shown in FIG. 3 at S20, deposits dopant film 106 on amorphous silicon film 104 in the trench as shown in FIG. 2C.

Figure 1C:
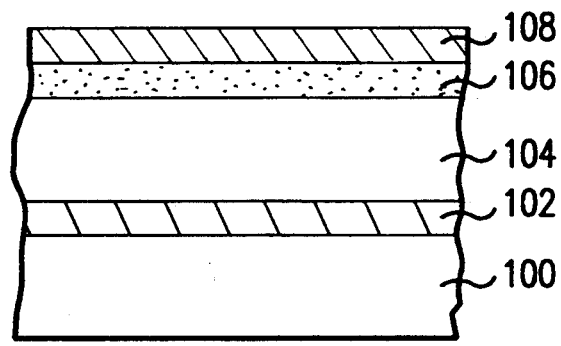
Figure 3:
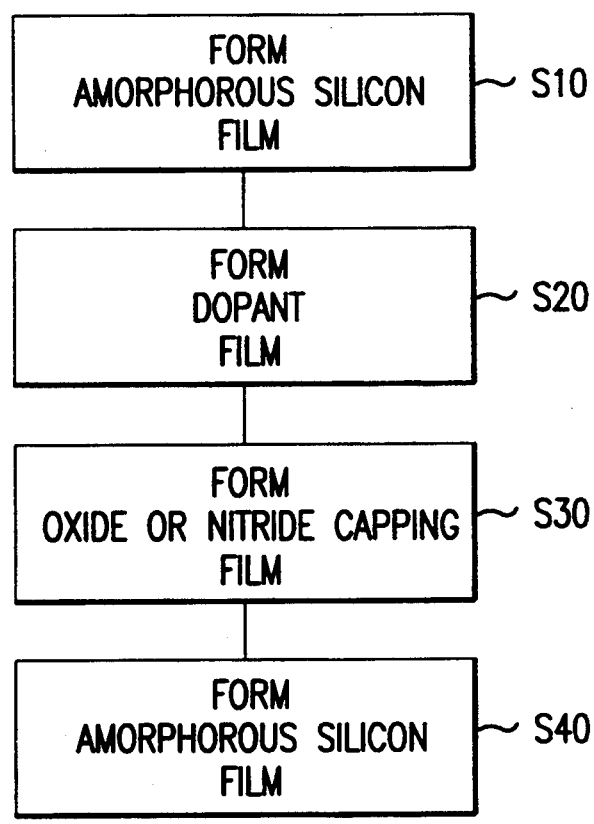
FIG. 3 is a flow chart showing the process steps of the present invention.

Next, capping layer 108 is formed on dopant layer 106 in FIGS. 1C and 2D. This process step is shown in FIG. 3 at S30. This process step may deposit either a silicon nitride or silicon dioxide film.

When a silicon dioxide film is formed, the film is formed by flowing oxygen gas over the semiconductor device, typically at temperatures between 1500° and 600° C. and pressures between 100 and 788 milli-Torrs. When a silicon nitride layer is formed instead of a silicon dioxide layer, the nitride layer is formed by thermal nitridation (e.g., flowing NH$_3$ gas over the semiconductor device at suitable temperature and pressure) or nititride deposition by reacting a SiCl$_2$H$_2$ and NH$_3$ gas mixture in a thermal decomposition process.

Figure 1D:
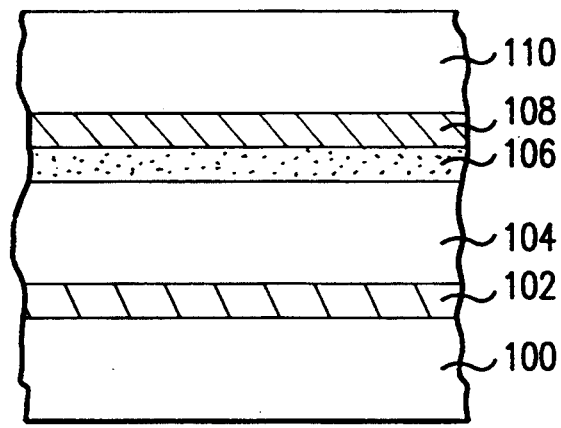

This capping layer forms a hard base on which a second amorphus silicon film may be applied. As a result of the capping layer, the incubation time during the second amorphus silicon formation is minimized. In FIG. 1D and FIG. 2E, the second amorphous silicon layer 110 is grown, shown in FIG. 3 at S40, on the capping layer 108. The surface of amorphus silicon film 110 in FIG. 1D is smooth. The trench in FIG. 2E is filled with amorphus silicon layer 110 so as to be without seams or voids.

Figure 6B:
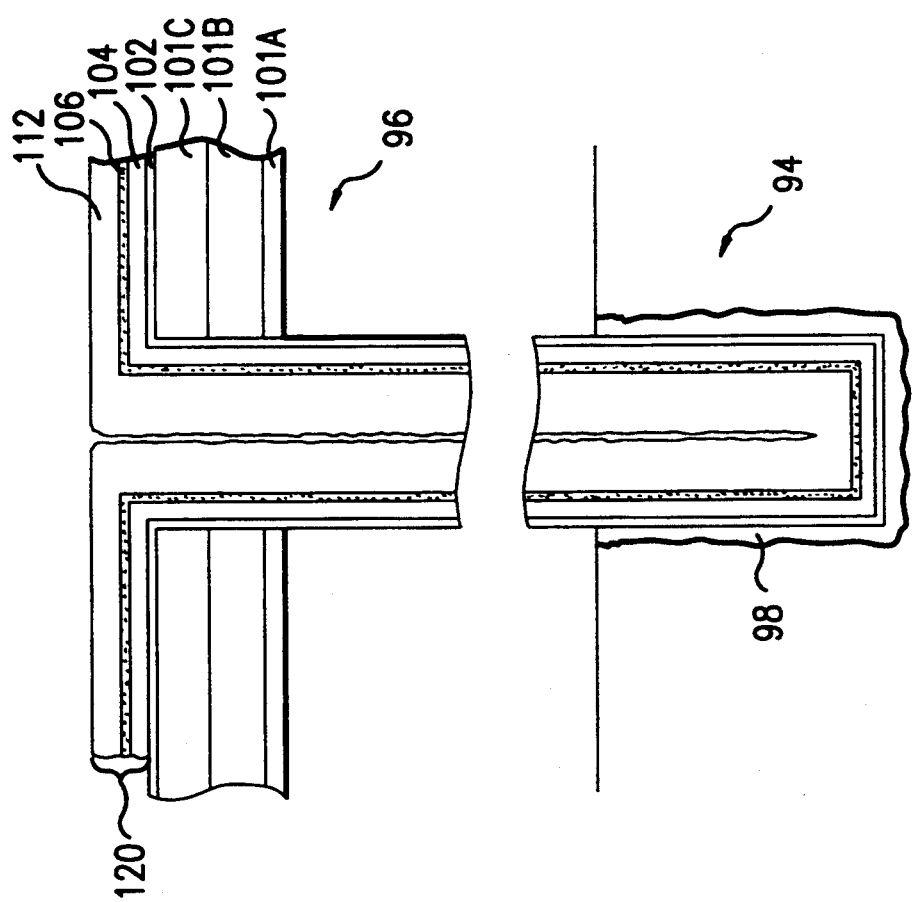
Figure 6A:
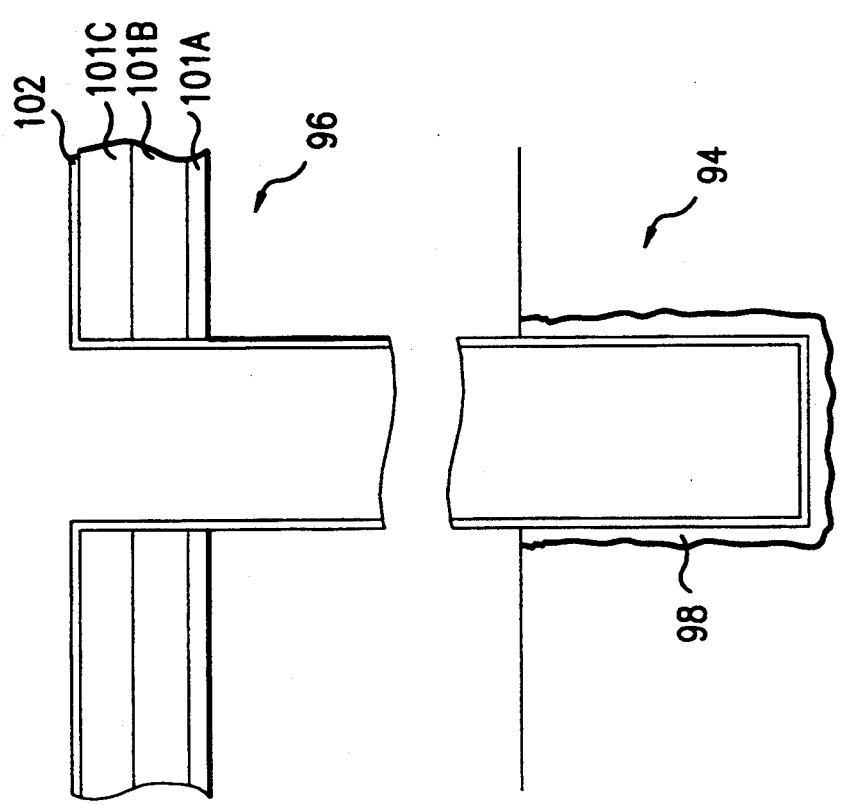
Figure 7:
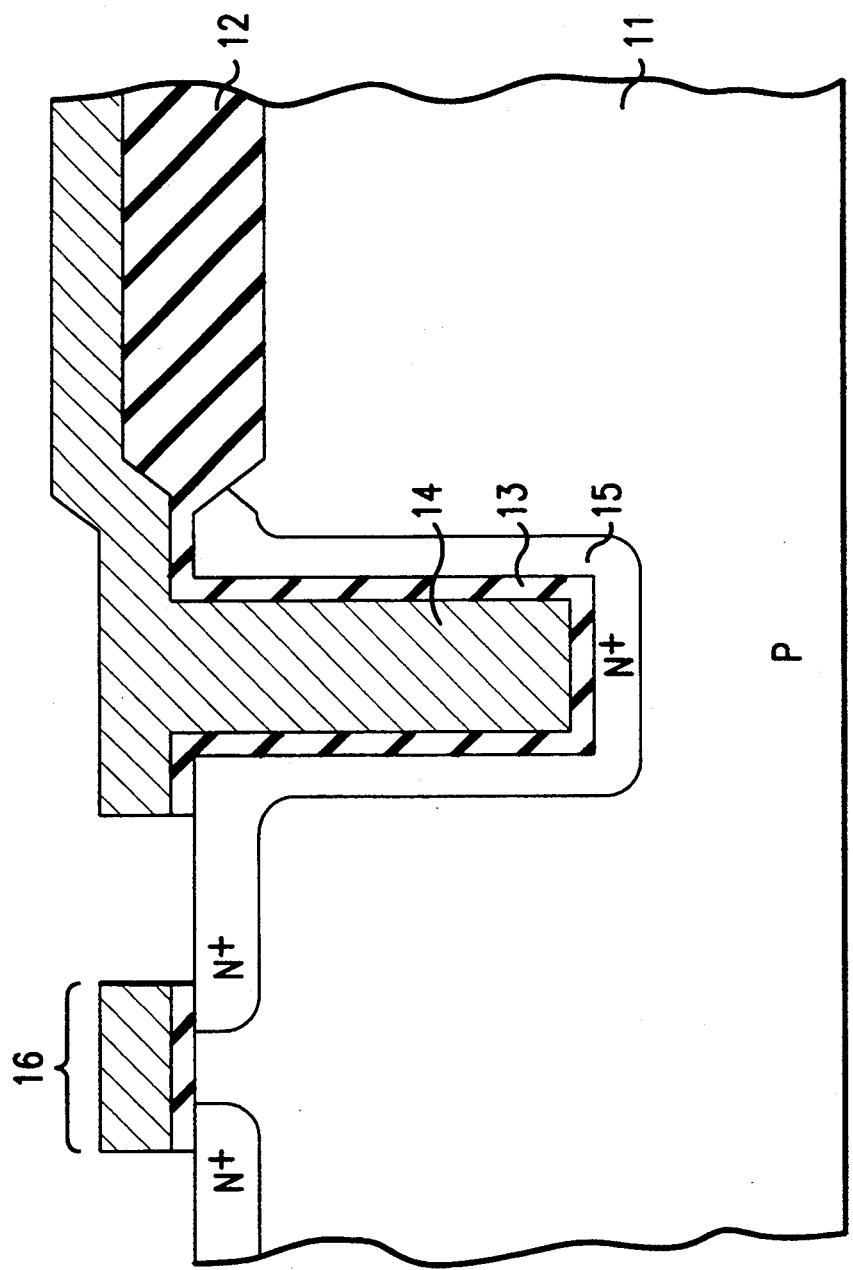
FIG. 7 is a sectional view of a conventional DRAM memory cell capacitor element.

In FIG. 2F, the trench is recess etched as discussed with respect to FIG. 6C, except that the recess etching process results in a smooth bottom of the recess due to an absense of voids and seams in amorphus silicon layer 110. Collar oxide 132 is formed and then second filling silicon 134' is deposited, second filling silicon 134' including a repretition of layers 104, 106, 108 and 110. At least in part due to capping layer 108, second filling silicon 134' is able to completely and smoothly fill the recess left after the structure of FIG. 2E is recess etched.

Having described preferred embodiments of a novel method for forming smooth doped silicon films and the films so formed (which are intended to be illustrative and not limiting), it is noted that modifications and variations can be made by those skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the following claims.

What is claimed is:

1. A method of forming a film structure in a trench, the trench having a dielectric film formed on a surface of the trench, the method comprising steps of:
    forming a first amorphous silicon film on the dielectric film;
    forming a dopant film;
    forming a second amorphous silicon film; and
    forming a capping film between the dopant film and one of the first and second amorphous silicon films, the dopant film being formed between the other of the first and second amorphous silicon films and the capping film.

2. The method of claim 1, wherein the step of forming a capping film forms the capping film from a capping material including one of SiO$_2$ and Si$_3$N$_4$.

3. The method of claim 1, wherein the step of forming a capping film includes a step of thermal nitridation.

4. The method of claim 1, wherein the step of forming a capping film includes a step of thermal nitridation with NH$_3$.

5. The method of claim 1, wherein the step of forming a capping film includes a step of nititride deposition.

6. The method of claim 1, wherein the step of forming a capping film includes a step of nititride deposition by gas thermal decomposition of a mixture of SiCl$_2$H$_2$ and NH$_3$.

7. In a trench formed in a substrate, the trench having a dielectric film formed on a surface of the trench, a film structure comprising:
    a first amorphous silicon film formed on the dielectric film;
    a dopant film;
    a second amorphous silicon film; and
    a capping film formed between the dopant film and one of the first and second amorphous silicon films, the dopant film being formed between the other of the first and second amorphous silicon films and the capping film, the capping film being formed from a capping material including one of SiO$_2$ and Si$_3$N$_4$.

8. The film structure of claim 1, wherein the capping film is formed from a capping material including one of SiO$_2$ and Si$_3$N$_4$.

9. The film structure of claim 1, wherein the dopant film is formed of a dopant material including one of phosphorus and arsenic.

10. A semiconductor device having a substrate and a trench formed therein, the semiconductor device comprising:
    a dielectric film formed on a surface of the trench;
    a first amorphous silicon film formed on the dielectric film;
    a dopant film;
    a second amorphous silicon film; and
    a capping film formed between the dopant film and one of the first and second amorphous silicon films, the dopant film being formed between the other of the first and second amorphous silicon films and the capping film, the capping film being formed from a capping material including one of SiO$_2$ and Si$_3$N$_4$.

* * * * *